(12) United States Patent
Chen et al.

(10) Patent No.: US 8,897,027 B2
(45) Date of Patent: Nov. 25, 2014

(54) BONDING PAD STRUCTURE

(75) Inventors: Han-Chung Chen, Taichung County (TW); Chun-Yi Wu, Taichung (TW); Shih-Cheng Wang, Changhua County (TW); Chin-Mei Huang, Taichung (TW); Tsui-Chuan Wang, Taichung County (TW); Pei-Fang Tsai, Taichung County (TW)

(73) Assignee: Wintek Corporation, Taichung (TW)

( * ) Notice: Subject to any disclaimer, the term of this patent is extended or adjusted under 35 U.S.C. 154(b) by 619 days.

(21) Appl. No.: 13/117,614

(22) Filed: May 27, 2011

(65) Prior Publication Data

US 2011/0292625 A1   Dec. 1, 2011

(30) Foreign Application Priority Data

Jun. 1, 2010   (TW) ............................ 99117523 A

(51) Int. Cl.
| | |
|---|---|
| *H05K 7/10* | (2006.01) |
| *H05K 7/12* | (2006.01) |
| *H05K 1/02* | (2006.01) |
| *H05K 1/11* | (2006.01) |
| *H01L 33/62* | (2010.01) |
| *H05K 3/34* | (2006.01) |
| *H01L 23/00* | (2006.01) |

(52) U.S. Cl.
CPC ...... *H05K 1/111* (2013.01); *H05K 2201/09663* (2013.01); *H01L 2924/12041* (2013.01); *H01L 2924/1205* (2013.01); *H01L 33/62* (2013.01); *H05K 3/3442* (2013.01); *H05K 1/0295* (2013.01); *H01L 2224/83801* (2013.01); *H01L 24/83* (2013.01); *H05K 2201/10636* (2013.01); *H01L 2224/8338* (2013.01); *H01L 2924/1206* (2013.01); *H01L 2924/1207* (2013.01); *H01L 2224/83385* (2013.01)
USPC ........... 361/767; 361/760; 361/764; 361/768; 361/776; 174/263; 174/264

(58) Field of Classification Search
CPC .................... H05K 2201/09418; H05K 1/111; H05K 2201/09381; H05K 2201/0939; H05K 2201/10636; H05K 2201/10674
USPC ........................... 361/760–776; 174/259–266
See application file for complete search history.

(56) References Cited

U.S. PATENT DOCUMENTS

| | | | | |
|---|---|---|---|---|
| 4,164,778 | A * | 8/1979 | Sawairi et al. ................ | 361/777 |
| 4,883,920 | A * | 11/1989 | Tanabe et al. ................. | 174/263 |
| 6,316,736 | B1 * | 11/2001 | Jairazbhoy et al. ........... | 174/260 |
| 6,405,920 | B1 * | 6/2002 | Brunner et al. ............ | 228/248.1 |
| 7,036,217 | B2 * | 5/2006 | Pearson et al. ................. | 29/840 |

FOREIGN PATENT DOCUMENTS

| | | |
|---|---|---|
| TW | I256698 | 6/2006 |
| TW | I271135 | 1/2007 |

\* cited by examiner

*Primary Examiner* — Tuan T Dinh
(74) *Attorney, Agent, or Firm* — WPAT, PC; Justin King

(57) ABSTRACT

A bonding pad structure is disclosed, which is composed of two bonding pad units that are symmetrically disposed with respect to an axial line. Each bonding pad units is further composed of at least two bonding pads, i.e. each bonding pad unit is composed of at least one first bonding pad and at least one second bonding pad. In an embodiment, the first bonding pad is arranged next to the axial line and the second bonding pad is arranged at a side of the corresponding first bonding pad away from the axial line while enabling the first bonding pad and the corresponding second bonding pad to be interconnected to each other by a first neck portion. Thereby, a plurality of solder areas of different sizes can be formed by the interconnecting of the at least two bonding pad units that can be used for soldering electronic components of different sizes.

11 Claims, 4 Drawing Sheets

BONDING PAD STRUCTURE

FIELD OF THE INVENTION

The present invention relates to a bonding pad structure, and more particularly, to a bonding pad structure adapted for the soldering of at least two electronic components of different sizes while preventing such electronic components from any displacement or tombstoning.

BACKGROUND OF THE INVENTION

The bonding pads that are adapted for soldering common electronic components, such as capacitors, resistors, inductors, or LEDs, are usually designed to be larger than the solder pin areas of those electronic components. During the soldering of foregoing electronic components to their corresponding bonding pad on a printed circuit board by passing the printed circuit board in a soldering pot, the electronic components to be soldered are still free to move around since the solder paste is still in liquid form, so that after passing through the soldering pot and the electronic components are soldered, some of the electronic components can be displaced and thus have contact to other electronic components that are short circuited. For LEDs, any displacement to the soldering of the LEDs may cause the LEDs to interfere with each other during assembling of a backlight module, so that some of the LEDs may be forced to come off the backlight module, and some may not be aligned to the light entrance of their corresponding light guide panel, and thus the brightness of the backlight module is declined.

Generally, any one bonding pad configured on a printed circuit board is specifically designed for the electronic components of a single specification. However, it is noted that the electronic components, such as capacitors, resistors and inductors, are usually constructed with various specifications. For instance, the size of an electronic component in 0402 specification is about 0.4 mm×0.2 mm, and the size of an electronic component in 0603 specification is about 0.6 mm×0.3 mm, so that the bonding pads designed respectively for the electronic components in 0402 specification and in 0603 specification should be formed according to different specifications. Therefore, unless a manufacture is constantly maintained a great inventory for the electronic components of a specific specification, it is more than often for the manufacturer to suffer a short stock problem when the suppliers are not able to supply sufficient its required electronic components of the specific specification, or the date of deliver is delayed. Nevertheless, if the manufacturer is propelled to replace the electronic components of the specific specification with electronic components of other specification, its circuit board design must be changed, and that is going to cause the cost of manufacture to increase, or even cause the delay in product delivery.

There are already many studies for solving the aforesaid problem. One of which is a bonding pad for printed circuit board, disclosed in TW Pat. No. I271135, that is provided for a first surface mounting device and a second surface mounting device to mount thereon. The bonding pad includes a plurality of pads that each of the pads is composed of a first part and a second part, whereas the first part is shaped about the same as the pin area of the first surface mounting device so as to be provided for the first surface mounting device to mount thereon, while the second part is shaped about the same as the pin area of the second surface mounting device so as to be provided for the second surface mounting device to mount thereon. Thus, the aforesaid bonding pad can be used for mounting different surface mounting devices without exhausting much of the limited layout space available on the printed circuit board. However, as each pad in the bonding pad is composed of a first part and a second part that are connected with each other and form a comparatively large solder area, device displacement or tombstoning might be caused when it is used for soldering a small-sized second surface mounting device.

Another such study is a highly compatible solder pad structure, disclosed in TW Pat. No. I256698, which is adapted for soldering electronic components of various specifications by the application of surface mounted technology, by that an electronic component to be mounted is able to maintain good electrical connection to at least two solder pads on a circuit board. The aforesaid solder pad structure is featuring in that: there are recesses formed on the two neighboring solder pads on a circuit board respectively at sides neighboring to each other and at positions corresponding to each other, so that electronic components of different specifications can be soldered onto the two solder pads at areas defined by the two recesses. Accordingly, by the arrangement of the recesses, the solder pad structure can be provided for electronic components of different specifications to mount thereon that not only the manufacturing cost can be reduced, but also the aforesaid tombstoning can be resolved. However, since each of the solder pad in the solder pad structure is shaped like a bar, there can be two third of the solder pad structure that is not occupied when it is used for soldering a small-sized electronic component, so that many of the limited layout space available on the circuit board is wasted. In addition, the aforesaid solder pad structure can only be adapted for only the electronic components of 0201 and 0204 specifications, that when it is used for soldering other electronic components whose sizes are smaller than the 0201 specification, device displacement and tombstoning are still inevitable.

SUMMARY OF THE INVENTION

In view of the disadvantages of prior art, the object of the present invention is to provide a bonding pad structure adapted for the soldering of at least two electronic components of different sizes on a substrate while preventing such electronic components from any displacement or tombstoning.

To achieve the above object, the present invention provides a bonding pad structure, which is composed of two bonding pad units that are symmetrically disposed with respect to an axial line; and each bonding pad units is further composed of at least two bonding pads, while enabling the at least two bonding pads to be composed of at least one first bonding pad and at least one second bonding pad in a manner that the first bonding pad is arranged next to the axial line, and the second bonding pad is arranged at a side of the corresponding first bonding pad away from the axial line, and further the first bonding pad and the corresponding second bonding pad are interconnected to each other by a first neck portion, and thereby, a plurality of solder areas of different sizes can be formed by the interconnecting of the at least two bonding pad units that can be used for soldering electronic components of different sizes.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
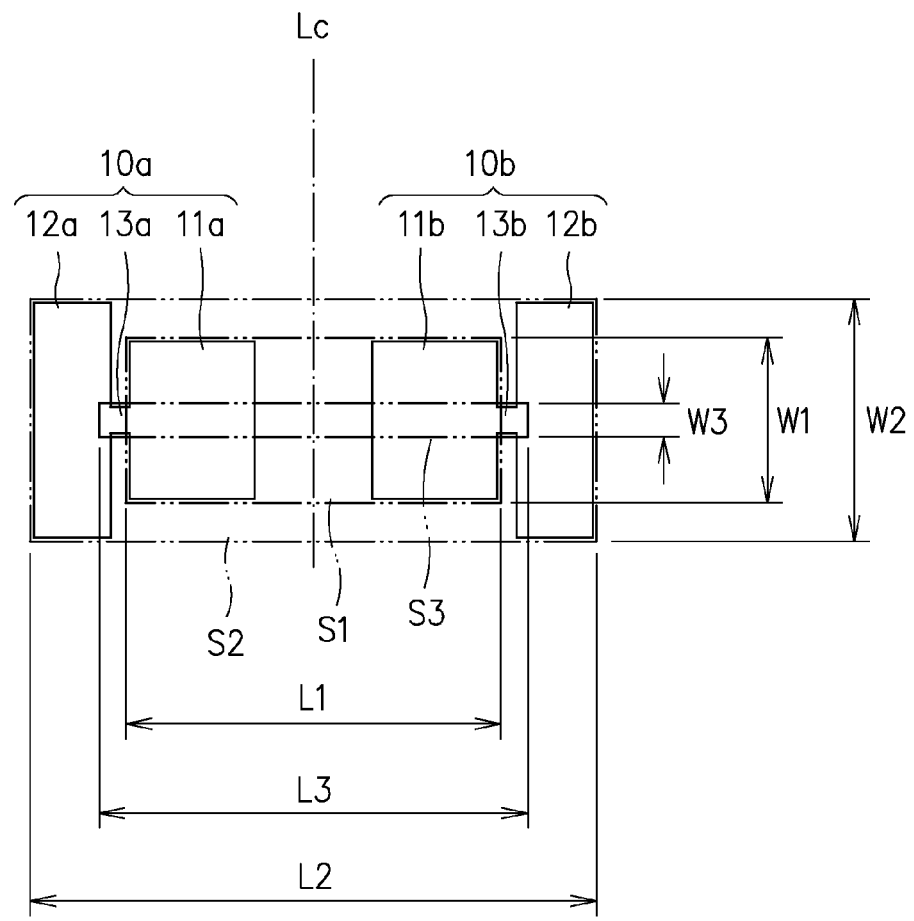
FIG. 1 is a schematic diagram showing a bonding pad structure according to a first embodiment of the present invention.

Please refer to FIG. 1, which is a schematic diagram showing a bonding pad structure according to a first embodiment of the present invention. As shown in FIG. 1, the bonding pad structure is comprised of two bonding pad units 10a, 10b, that are symmetrically disposed with respect to an axial line Lc. The bonding pad units 10a is composed of a first bonding pad 11a and a second bonding pad 12a, whereas the first bonding pad 11a and the second bonding pad 12a are interconnected with each other by a first neck portion 13a. Moreover, the first neck portion 13a is extending in a direction perpendicular to the axial line Lc. Similarly, being formed symmetrical with the bonding pad unit 10a, another bonding pad unit 10b is also composed of a first boding pad 11b and a second bonding pad 12b that are interconnected with each other by another neck portion 13b. In the bonding pad structure of the embodiment, the two first bonding pads 11a, 11b respectively from the two bonding pad units 10a, 10b are disposed next to each other at the two opposite sides of the axial line Lc, while the second bonding pads 12a, 12b are respectively arranged at sides of their corresponding first bonding pad 11a, 11b that is away from the axial line Lc. As shown in FIG. 1, the two second bonding pads 12a, 12b are disposed outside their corresponding first bonding pads 11a, 11b, while enabling the two first neck portions 13a, 13b to be extended in a direction perpendicular to the axial line Lc. In this embodiment, the first neck portion 13a is connected to the middles of the first bonding pad 11a and the second bonding pad 12a, while another first neck portion 13b is connected to the middles of the first bonding pad 11b and the second bonding pad 12b, and the two neck portions 13a, 13b are arranged parallel with each other while being aligned on a same level.

As shown in FIG. 1, by the combination of the two first bonding pads 11a, 11b and the area enclosed by the two first bonding pad 11a, 11b, a first solder area S1 is constructed which is a rectangle area of L1 length and W1 width. Moreover, by the combination of the two bonding pad units 10a, 10b and the area enclosed by the two bonding pad units 10a, 10b, a second solder area S2 is constructed which is a rectangle area of L2 length and W2 width. It is noted that he aforesaid first solder area S1 is included inside the second solder area S2, i.e. the second solder area S2 includes the two second bonding pads 12a, 12b, the two first neck portions 13a, 13b, the two first bonding pads 11a, 11b and those areas defined between the two first bonding pads 11a, 11b as well as the two second bonding pads 12a, 12b. In addition, by the combination of the two first neck portions 13a, 13b and the area enclosed by the two first neck portions 13a, 13b, a third solder area S3 is constructed which is a rectangle area of L3 length and W3 width. Since the first neck portion 13a is provided for connecting the first bonding pads 11a to the second bonding pad 12a and the first neck portion 13b is provided for connecting the first bonding pads 11b to the second bonding pad 12b, a portion of the two first bonding pads 11a, 11n and also a portion of the two second bonding pads 12a, 12b are included in the third solder area S3. Thereby, from inside out, the third solder area S3 is included inside the first solder area S1, while both the first solder area S1 and the third solder area S3 are included inside the second solder area S2.

Figure 2:
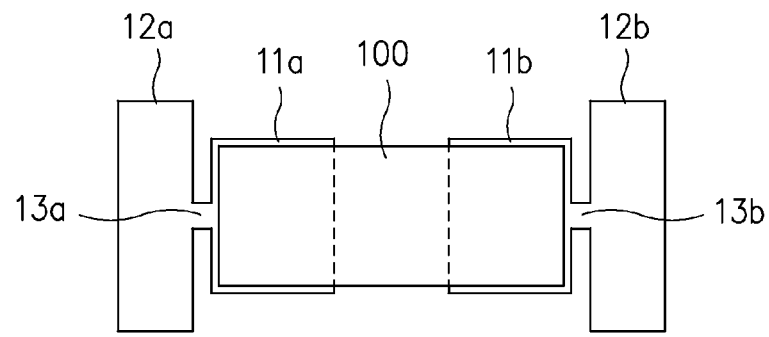
FIG. 2 is a schematic diagram illustrating an electronic component of 0402 specification being mounted on the bonding pad structure of FIG. 1.
Figure 3:
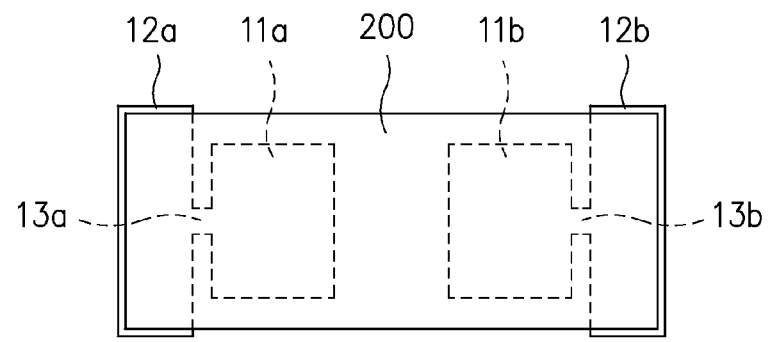
FIG. 3 is a schematic diagram illustrating an electronic component of 0603 specification being mounted on the bonding pad structure of FIG. 1.
Figure 4:
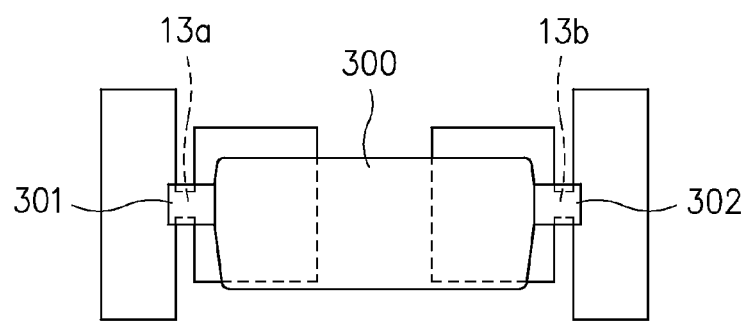
FIG. 4 is a schematic diagram illustrating a LED being mounted on the bonding pad structure of FIG. 1.

According to the sizes of the first bonding pads 11a, 11b, the second bonding pads 12a, 12b and the first neck portions 13a, 13b which can be different from each other, the sizes of the first solder area S1, the second solder area S3, and the third solder area S3 will be different from each other. As shown in FIG. 2 and FIG. 3, there is a first electronic component 100 mounted on the two first bonding pads 11a, 11b, and a second electronic component 200 that is slightly larger than the one shown in FIG. 2 being mounted on the two second bonding pads 12a, 12b. In this embodiment, the first electronic component 100 is an electronic component of 0402 specification while the second electronic component 200 is an electronic component of 0603 specification. Moreover, as shown in FIG. 4, the solder area S3, that is the smallest, can be used for mounting a third electronic component 300, such as LEDs, which should be configured with symmetrically disposed pins 301, 302 that can be soldered respectively on the two first neck portions 13a, 13b.

It is noted that, since the first bonding pads 11a, 11b are connected to the corresponding second bonding pads 12a, 12b by the first neck portions 13a, 13b that are comparatively narrower than those bonding pads 11a, 11b, 12a and 12b, the stress with respect to the two second bonding pads 12a, 12b that is resulting from the soldering of a smaller electronic component 100 on the two first bonding pads 11a, 11b, as that shown in FIG. 2, will be restricted to the first neck portions 13a, 13b, and thus the unwanted tombstoning can be prevented.

Nevertheless, for solder a large-sized electronic component, as that shown in FIG. 3, the second electronic component 200 is soldered simultaneously on the two first bonding pads 11a, 11b, the two second bonding pads 12a, 12 and the two first neck portions 13a, 13b so that the solder strength can be ensured. Moreover, as shown in FIG. 4, since the soldering of the third electronic component 300 is restricted to the two first neck portions 13a, 13b, the adverse affects of device displacement and tombstoning can be prevented.

Figure 5:
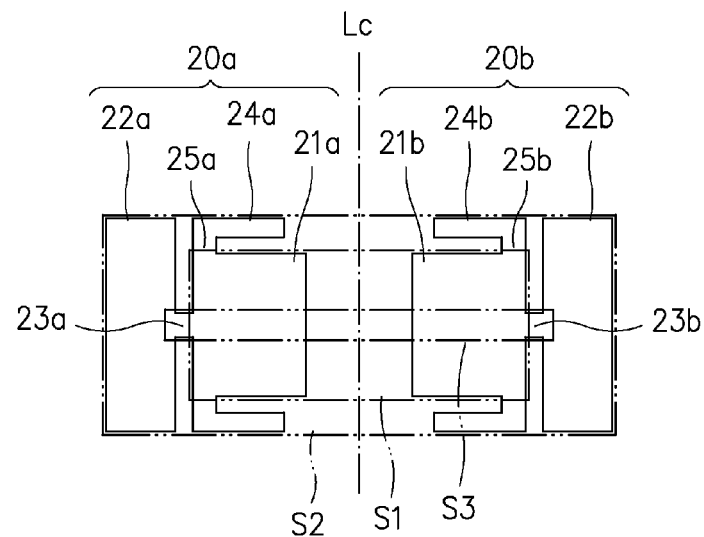
FIG. 5 is a schematic diagram showing a bonding pad structure according to a second embodiment of the present invention.

Please refer to FIG. 5, which is a schematic diagram showing a bonding pad structure according to a second embodiment of the present invention. Similarly, the bonding pad structure of FIG. 5 is composed of two bonding pad units 20a, 20b that are symmetrically disposed with respect to an axial line Lc. Taking the bonding pad unit 20a for example, it is composed of a first bonding pad 21a, a second bonding pad 22a and a first neck portion 23, in that the first bonding pad 21a and the second bonding pad 22a are interconnected with each other by the first neck portion 23a while the first neck portion 23a is extending in a direction perpendicularly to the axial line Lc. Nevertheless, the bonding pad structure of the second embodiment is featuring in that: the first bonding pad 21a further has a pair of first reinforcement pads 24a disposed respectively and perpendicularly at two sides of the axial line Lc while enabling each of the two first reinforcement pads 24a to be connected to the first boding pad 21a by a first auxiliary neck portion 25a; and each of the two first reinforcement pads 24a is extending in a direction perpendicular to the axial line Lc while each first auxiliary neck portion 25a that is used for connecting the first reinforcement pads 24a to the first bonding pad 21a is extending in a direction parallel to the axial line Lc.

Similarly, the second bonding pad unit 20b, being constructed symmetrical to the bonding pad unit 20a, is also composed of a first bonding pad 21b, a second bonding pad 22b, a first neck portion 23b, a pair of first reinforcement pads 24b, and two first auxiliary neck portion 25b. As shown in FIG. 5, by the combination of the two bonding pad units 20a, 20b and the area enclosed by the two bonding pad units 20a, 20b, a second solder area S2 is constructed. Thus, for solder a large-sized electronic component, as second electronic component 200 shown in FIG. 3, the solder strength can be improved by the cooperation between the first reinforcement pad 24a and the second bonding pad 22a, comparing with the foregoing embodiments that are configured without the reinforcement pad 24a. Similarly, by the combination of the two first bonding pads 21a, 21b and the area enclosed by the two first bonding pad 21a, 21b, a first solder area S1 is constructed; and also by the combination of the two first neck portions 23a, 23b and the area enclosed by the two first neck portions 23a, 23b, a third solder area S3 is constructed.

Figure 6:
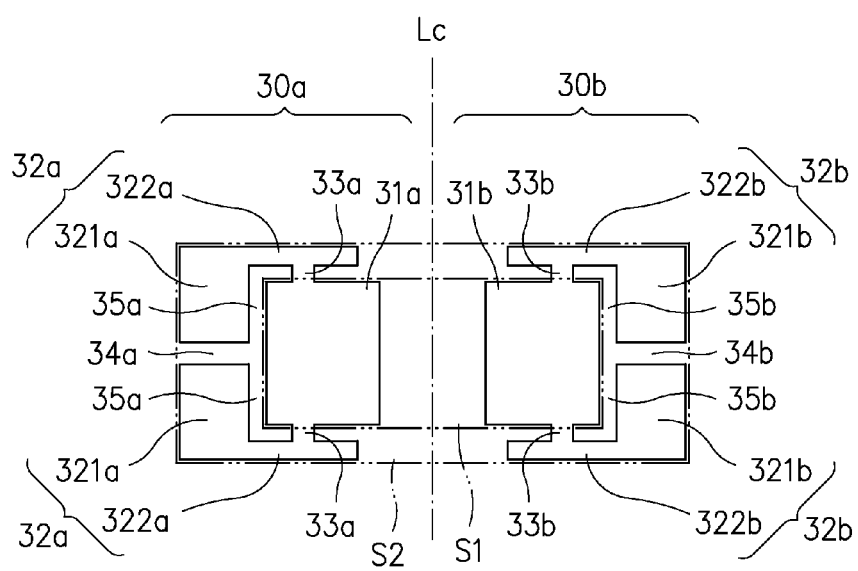
FIG. 6 is a schematic diagram showing a bonding pad structure according to a third embodiment of the present invention.

Please refer to FIG. 6, which is a schematic diagram showing a bonding pad structure according to a third embodiment of the present invention. In this embodiment, the bonding pad structure is also composed of two bonding pad units 30a, 30b while enabling the two to be symmetrically disposed with respect to an axial line Lc. Taking the bonding pad unit 30a for example, it is composed of a first bonding pad 31a and two second bonding pads 32a, in that each of the two second bonding pads 32a is a L-shaped element composed of a second master pad 321a and a second auxiliary pad 322a. Moreover, the two second master pads 321a are arranged along a direction parallel with the axial line Lc at a side of the first bonding pad 31a that is away from the axial line Lc, while enabling the two second master pads 321a to be spaced from each other by a first interval 34a; and further in the bonding pad unit 30a, the two second auxiliary pads 322a are respectively disposed at two sides of their corresponding first bonding pad 31a that are perpendicular to the axial line Lc, while enabling each of the two second auxiliary pads 322a to be connected to the first bonding pad 31a by a first neck portion 33a. It is noted that the first neck portion 33a is extending in a direction parallel to the axial line Lc. Moreover, the two second bonding pads 32a are spaced from the first bonding pad 31a by a second interval 35a while enabling the second interval 35a to communicate with the first interval 34a so as to form a continuing pathway.

Similarly, being formed symmetrical with the bonding pad unit 30a, another bonding pad unit 30b is also composed of a first boding pad 31b and two second bonding pads 32b, in that each of the two second bonding pads 32b is composed of a second master pad 321b and a second auxiliary pad 322b. Moreover, the two second master pads 321b are spaced from each other by a first interval 34b; and further in the bonding pad unit 30a, the two second auxiliary pads 322b are respectively connected to the first bonding pad 31b by a first neck portion 33b. Moreover, the two second bonding pads 32b are spaced from the first bonding pad 31b by a second interval 35b while enabling the second interval 35b to communicate with the first interval 34b so as to form a continuing pathway. Similarly, by the combination of the two bonding pad units 30a, 30b and the area enclosed by the two bonding pad units 30a, 30b, a second solder area S2 is constructed; and by the combination of the two first bonding pads 31a, 31b and the area enclosed by the two first bonding pad 31a, 31b, a first solder area S1 is constructed. The formation of the first intervals 34a, 34b and the second intervals 35a, 35b is acting for dispersing stress, by that the tombstoning effect can be prevented in a situation, for example, while soldering a small electronic component on the first solder are S1, as that shown in FIG. 2.

Figure 7:
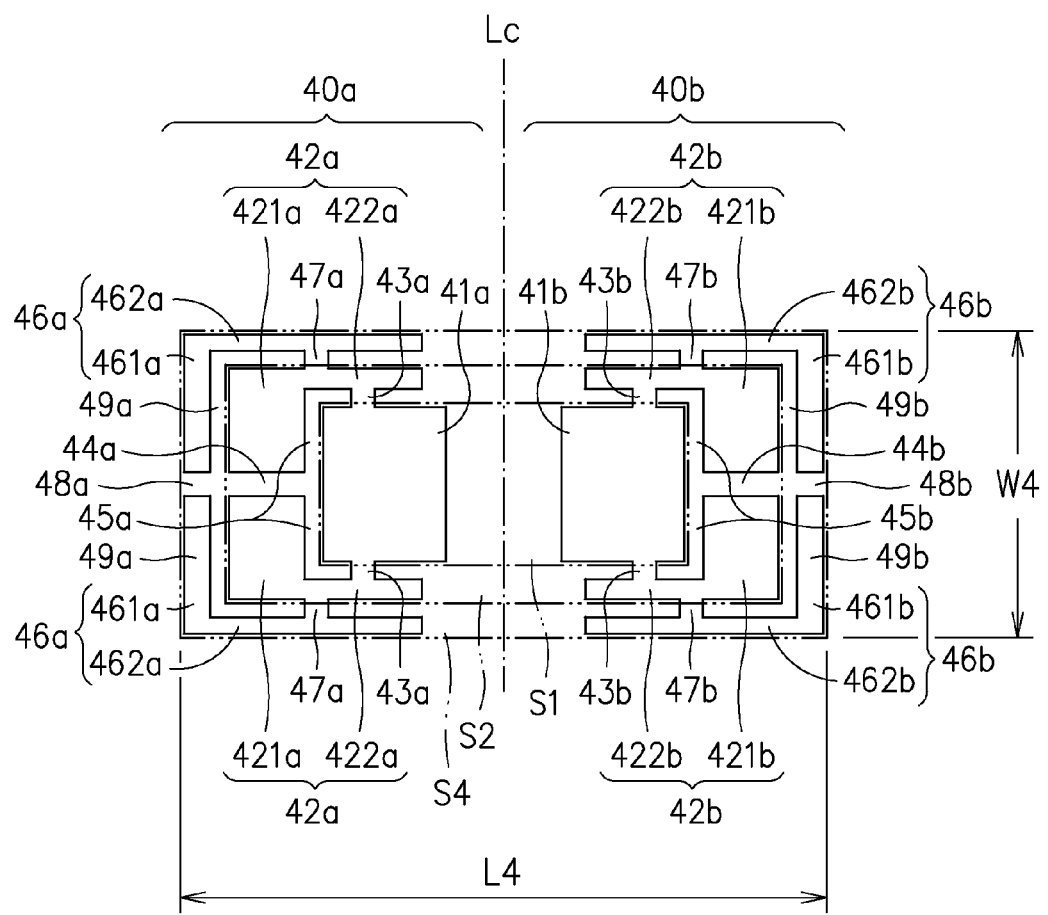
FIG. 7 is a schematic diagram showing a bonding pad structure according to a fourth embodiment of the present invention.

Please refer to FIG. 7, which is a schematic diagram showing a bonding pad structure according to a fourth embodiment of the present invention. The bonding pad structure of the fourth embodiment is basically the same as the one shown in the third embodiment, which is also composed of two bonding pad units 40a, 40b that are symmetrically disposed with respect to an axial line Lc. Taking the bonding pad unit 40a for example, it is composed of a first bonding pad 41a and two second bonding pads 42a, in that each of the two second bonding pads 42a is a L-shaped element composed of a second master pad 421a and a second auxiliary pad 422a. Moreover, the two second master pads 421a are spaced from each other by a first interval 44a; and further the two second bonding pads 42a are also spaced from the first bonding pad 41a by a second interval 45a, while enabling the second interval 45a to communicate with the first interval 44a so as to form a continuing pathway. However, the bonding pad structure of the fourth embodiment is different from the third embodiment in that: the bonding pad unit 40 further includes two third bonding pads 46a that each of the third bonding pads 46a is formed as a L-shaped element composed of a third master pad 461a and a third auxiliary pad 462a. Moreover, the two third master pads 461a are arranged along a direction parallel with the axial line Lc at a side of the corresponding two second bonding pad 42a that is away from the axial line Lc, while enabling the two third master pads 461a to be spaced from each other by a third interval 48a; and further in the bonding pad unit 30a, the two third auxiliary pads 462a are respectively disposed at two sides of their corresponding two second bonding pad 42a that are perpendicular to the axial line Lc, while enabling each of the two third auxiliary pads 462a to be connected to their corresponding second bonding pad 42a by a second neck portion 47a. It is noted that the second neck portion 47a is extending in a direction parallel to the axial line Lc. Moreover, the two third bonding pads 46a are spaced from the corresponding second bonding pads 42a by a fourth interval 49a, while enabling the fourth interval 49a to communicate with the third interval 48a, the first interval 44a, and the second interval 45a into a continuing pathway.

Similarly, being formed symmetrical with the bonding pad unit 40a, another bonding pad unit 40b is also composed of a first boding pad 41b, two second bonding pad 42b, and two third bonding pads 46b, in that each of the two second bonding pads 42b is composed of a second master pad 421b and a second auxiliary pad 422b, whereas each of the two second auxiliary pads 422b is connected to its corresponding first bonding pad 41b by a first neck portion 43b, and the two second bonding pads 41b are spaced from the first bonding pad 41b by a second interval 34b while enabling the second interval 45b to communicate with the first interval 44b so as to form a continuing pathway. Moreover, each of the third bonding pads 46b is formed as a L-shaped element composed of a third master pad 461b and a third auxiliary pad 462b. Moreover, the two third master pads 461b are spaced from each other by a third interval 48b; and further, each of the two third auxiliary pads 462b is connected to their corresponding second bonding pad 42b by a second neck portion 47b. Moreover, the two third bonding pads 46b are spaced from the corresponding second bonding pads 42b by a fourth interval 49b, while enabling the fourth interval 49b to communicate with the third interval 48b, the first interval 44b, and the second interval 45b into a continuing pathway. Similarly, by the combination of the two bonding pad units 40a, 40b and the area enclosed by the two bonding pad units 40a, 40b, a fourth solder area S4 is constructed which is a rectangle area of L4 length and W4 width, that can be used for soldering electronic components of various sizes, such as the first electronic component 100 shown in FIG. 1, the second electronic component 200 shown in FIG. 2 and the third electronic component 300 shown in FIG. 3. In addition, by the combination of the two second bonding pads 42a, 42b and the area enclosed by the two second bonding pad 42a, 42b, a second solder area S2 is constructed; and by the combination of the two first bonding pads 41a, 41b and the area enclosed by the two first bonding pad 41a, 41b, a first solder area 12 is constructed. The formation of the first intervals 44a, 44b, the second intervals 45a, 45b, and the third intervals 48a, 48b is acting for dispersing stress, by that the tombstoning effect can be prevented in a situation, for example, while soldering a small electronic component, such as the electronic component 100 shown in FIG. 2, on the first solder are S1, or while soldering a comparatively larger electronic component, such as the electronic component 200 shown in FIG. 3, on the solder area S2. It is illustrated in the present embodiment that, by the multiple neck connection structure and multi-layered pad formation, the bonding pad structure of the present invention can be adapted for soldering various electronic components of different sizes.

To sum up, by the multi-layered pad formation, the bonding pad structure of the present invention can be adapted for soldering at least two types of electronic components of different specifications, which not only allows the exchangeability between electronic components to be increased, but also prevent the device displacement and tombstoning from happening during soldering.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A bonding pad structure for connecting an electronic component mounted on a printed circuit board (PCB), said structure, comprising:
   two bonding pad units, symmetrically disposed with respect to an axial line;
   wherein, each bonding pad unit has at least two bonding pads, each of the at least two bonding pads is composed of at least one first bonding pad and at least one second bonding pad in a manner that the first bonding pad is arranged next to the axial line,
and the second bonding pad is arranged at a side of the corresponding first bonding pad that is away from the axial line, and further the first bonding pad and the corresponding second bonding pad are interconnected to each other by a first neck portion:
   wherein the first bonding pad, the second bonding pad, and the first neck portion are used for soldering the electronic component so as a plurality of solder areas of different sizes are formed by interconnecting the two bonding pad units.

2. The bonding pad structure of claim 1, wherein each of the two bonding pad unit further comprises at least one third bonding pad that is disposed at a side of the corresponding second bonding pad that is away from its corresponding first bonding pad while enabling the at least one third bonding pad and the corresponding second bonding pad to be interconnected to each other by a second neck portion.

3. The bonding pad structure of claim 1, wherein each bonding pad unit is composed of one said first bonding pad and one said second bonding pad in a manner that the first bonding pad and the second bonding pad are interconnected to each other by a first neck portion, while enabling the first neck potion to extend in a direction perpendicular to the axial line.

4. The bonding pad structure of claim 1, wherein the first bonding pad further comprises a pair of first reinforcement pads disposed respectively and perpendicularly at two sides of the axial line while enabling each of the first reinforcement pads to be connected to the first boding pad by a first auxiliary neck portion.

5. The bonding pad structure of claim 4, wherein each of the first reinforcement pad and the first auxiliary neck portion of the corresponding first bonding pad are extending in a direction parallel to the axial line.

6. The bonding pad structure of claim 1, wherein each bonding pad unit is composed of one said first bonding pad and two said second bonding pads in a manner that each of the two second bonding pads is configured with the first neck portion so as to be used for connecting to the first bonding pad thereby.

7. The bonding pad structure of claim 6, wherein the first neck portion is extending in a direction parallel to the axial line.

8. The bonding pad structure of claim 7, wherein each of the two second bonding pads is composed of a second master pad and a second auxiliary pad; and in each bonding pad unit, the two second master pads are arranged along a direction parallel with the axial line at a side of the first bonding pad that is away from the axial line, while enabling the two second master pads to be spaced from each other by an interval; and further in each bonding pad unit, the two second auxiliary pads are respectively disposed at two sides of their corresponding first bonding pad that are perpendicular to the axial line, while enabling each of the two second auxiliary pads to be connected to the first bonding pad by a first neck portion.

9. The bonding pad structure of claim 8, wherein each first neck portion that is used for connecting the first bonding pad to the corresponding second auxiliary pad is extending in a direction parallel to the axial line.

10. The bonding pad structure of claim 8, wherein each bonding pad unit is further comprised of two third bonding pads; and each of the two third bonding pads is composed of a third master pad and a third auxiliary pad in a manner that, in each bonding pad unit, the two third master pads are arranged along a direction parallel with the axial line at a side of the corresponding second bonding pad that is away from the axial line, while enabling the two third master pads to be spaced from each other by an interval; and further in each bonding pad unit, the two third auxiliary pads are respectively disposed at two sides of their corresponding two second bonding pad that are perpendicular to the axial line, while enabling each of the two third auxiliary pads to be connected to their corresponding second auxiliary pad by a second neck portion.

11. The bonding pad structure of claim 10, wherein each second neck portion is extending in a direction parallel to the axial line.

* * * * *